United States Patent
Xie et al.

(10) Patent No.: US 9,366,966 B2
(45) Date of Patent: Jun. 14, 2016

(54) ELECTRIC/MAGNETIC FIELD GUIDED ACID PROFILE CONTROL IN A PHOTORESIST LAYER

(71) Applicant: Applied Materials, Inc., Santa Clara, CA (US)

(72) Inventors: Peng Xie, Fremont, CA (US); Ludovic Godet, Sunnyvale, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 0 days.

(21) Appl. No.: 14/478,403

(22) Filed: Sep. 5, 2014

(65) Prior Publication Data

US 2016/0011515 A1    Jan. 14, 2016

Related U.S. Application Data

(60) Provisional application No. 62/023,101, filed on Jul. 10, 2014.

(51) Int. Cl.
*G03F 7/26* (2006.01)
*G03F 7/20* (2006.01)

(52) U.S. Cl.
CPC ............... *G03F 7/26* (2013.01); *G03F 7/2051* (2013.01)

(58) Field of Classification Search
CPC ....................................................... G03F 7/26
See application file for complete search history.

(56) References Cited

U.S. PATENT DOCUMENTS

| | | | |
|---|---|---|---|
| 5,158,861 A * | 10/1992 | Tokui | G03F 7/38 430/272.1 |
| 7,374,867 B2 | 5/2008 | Bristol et al. | |
| 2003/0008246 A1 | 1/2003 | Cheng et al. | |
| 2005/0074706 A1* | 4/2005 | Bristol | B82Y 10/00 430/327 |
| 2008/0008967 A1* | 1/2008 | Chang | G03F 7/0035 430/311 |
| 2012/0103939 A1 | 5/2012 | Wu et al. | |
| 2012/0322011 A1 | 12/2012 | Wu et al. | |

* cited by examiner

*Primary Examiner* — Kathleen Duda
(74) *Attorney, Agent, or Firm* — Patterson & Sheridan, LLP (57) ABSTRACT

Methods and apparatuses for minimizing line edge/width roughness in lines formed by photolithography are provided. In one example, a method of processing a substrate, the method includes applying a photoresist layer comprising a photoacid generator to a substrate, exposing a first portion of the photoresist layer unprotected by a photomask to a radiation light in a lithographic exposure process, and applying an electric field or a magnetic field to alter movement of photoacid generated from the photoacid generator substantially in a vertical direction.

19 Claims, 6 Drawing Sheets

ELECTRIC/MAGNETIC FIELD GUIDED ACID PROFILE CONTROL IN A PHOTORESIST LAYER

CROSS-REFERENCE TO RELATED APPLICATIONS

This application claims benefit of U.S. Provisional Patent Application Ser. No. 62/023,101, filed Jul. 10, 2014 which is incorporated by reference in its entirety.

BACKGROUND

1. Field

The present disclosure generally relates to methods and apparatuses for processing a substrate, and more specifically to methods and apparatuses for controlling photoresist line edge/width roughness.

2. Description of the Related Art

Integrated circuits have evolved into complex devices that can include millions of components (e.g., transistors, capacitors and resistors) on a single chip. Photolithography may be used to form components on a chip. Generally the process of photolithography involves a few basic stages. Initially, a photoresist layer is formed on a substrate. The photoresist layer may be formed by, for example, spin-coating. A chemically amplified photoresist may include a resist resin and a photoacid generator. The photoacid generator, upon exposure to electromagnetic radiation in the subsequent exposure stage, alters the solubility of the photoresist in the development process. The electromagnetic radiation may have any suitable wavelength, such as a wavelength in the extreme ultra violet region. The electromagnetic radiation may be from any suitable source, such as, for example, a 193 nm ArF laser, an electron beam, an ion beam, or other source. Excess solvent may then be removed in a pre-exposure bake process.

In an exposure stage, a photomask or reticle may be used to selectively expose certain regions of a photoresist layer disposed on the substrate to electromagnetic radiation. Other exposure methods may be maskless exposure methods. Exposure to light may decompose the photoacid generator, which generates acid and results in a latent acid image in the resist resin. After exposure, the substrate may be heated in a post-exposure bake process. During the post-exposure bake process, the acid generated by the photoacid generator reacts with the resist resin in the photoresist layer, changing the solubility of the resist of the photoresist layer during the subsequent development process.

Figure 1:
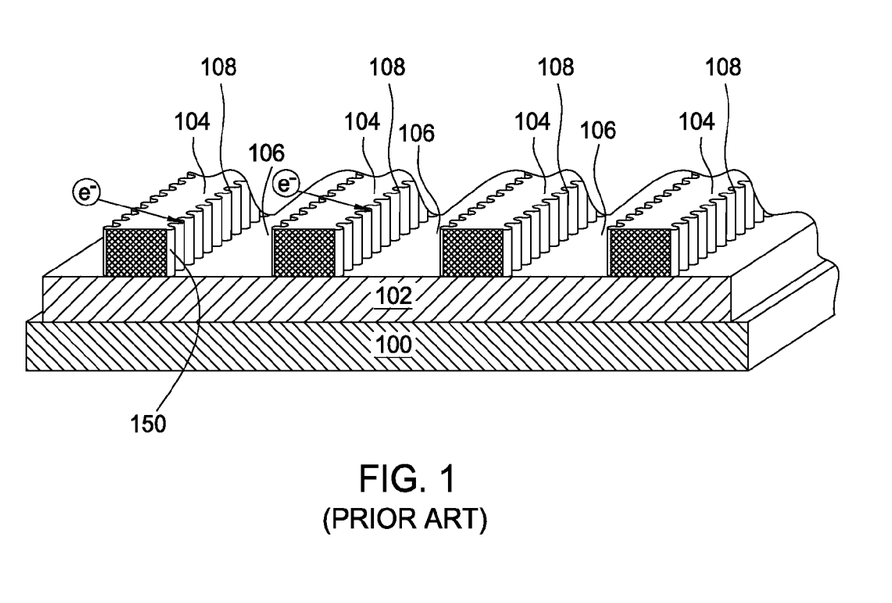
FIG. 1 depicts a top view of an exemplary structure of a patterned photoresist layer disposed on a substrate conventionally in the art.

After the post-exposure bake, the substrate, and, particularly, the photoresist layer may be developed and rinsed. After development and rinsing, a patterned photoresist layer is then formed on the substrate, as shown in FIG. 1. FIG. 1 depicts an exemplary top sectional view of the substrate 100 having the patterned photoresist layer 104 disposed on a target material 102 to be etched. Openings 106 are defined between the patterned photoresist layer 104, after the development and rinse processes, exposing the underlying target material 102 for etching to transfer features onto the target material 102. However, inaccurate control or low resolution of the lithography exposure process may cause in poor critical dimension of the photoresist layer 104, thereby resulting in unacceptable line width roughness (LWR) 108. Furthermore, during the exposure process, acid (shown as in FIG. 1) generated from the photoacid generator may randomly diffuse to any regions, including the regions protected under the mask unintended to be diffused, thereby creating undesired wigging or roughness profile 150 at the edge or interface of the patterned photoresist layer 104 interfaced with the openings 106. Large line width roughness (LWR) 108 and undesired wiggling profile 150 of the photoresist layer 104 may result in inaccurate feature transfer to the target material 102, thus, eventually leading to device failure and yield loss.

Therefore, there is a need for a method and an apparatus to control and minimize line width roughness (LWR) so as to obtain a patterned photoresist layer with desired critical dimensions.

Therefore, there is a need for a method and an apparatus to control and minimize line edge/width roughness.

SUMMARY

Embodiments of the present disclosure include a method and apparatus for efficient control of distribution and diffusion of acid from a photoacid generator included in a photoresist layer during an exposure process or a pre- or post-exposure baking process. In one example, a method of processing a substrate, the method includes applying a photoresist layer comprising a photoacid generator to a substrate, exposing a first portion of the photoresist layer unprotected by a photomask to a radiation light in a lithographic exposure process, and applying an electric field or a magnetic field to alter movement of photoacid generated from the photoacid generator substantially in a vertical direction.

In another example, a method of processing a substrate, the method includes applying a photoresist layer comprising a photoacid generator to a substrate, exposing a first portion of the photoresist layer unprotected by a photomask to a radiation light in a lithographic exposure process, and orienting photoacid formed in the first portion of the photoresist layer in a vertical direction perpendicular to a planar surface of the substrate.

In yet another example, a method of processing a substrate, the method includes applying a photoresist layer comprising a photoacid generator to a substrate, exposing a first portion of the photoresist layer unprotected by a photomask to a radiation light in a lithographic exposure process, and orienting photoacid formed in the first portion of the photoresist layer to minimize a lateral movement of photoacid.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, wherever possible, to designate identical elements that are common to the Figures. Additionally, elements of one embodiment may be advantageously adapted for utilization in other embodiments described herein.

DETAILED DESCRIPTION

Methods and apparatuses for minimizing line edge/width roughness in lines formed by photolithography are provided. The random diffusion of acid generated by a photoacid generator during a post-exposure bake procedure contributes to line edge/width roughness which may be mitigated utilizing the techniques disclosed herein. Methods disclosed herein apply an electric field and/or a magnetic field during photolithography processes. The field application controls the diffusion and distribution of the acids generated by the photoacid generator along the line and spacing direction, preventing the line edge/width roughness that results from random diffusion. Apparatuses and methods for controlling aforementioned acid distribution and diffusion are disclosed herein.

Figure 2:
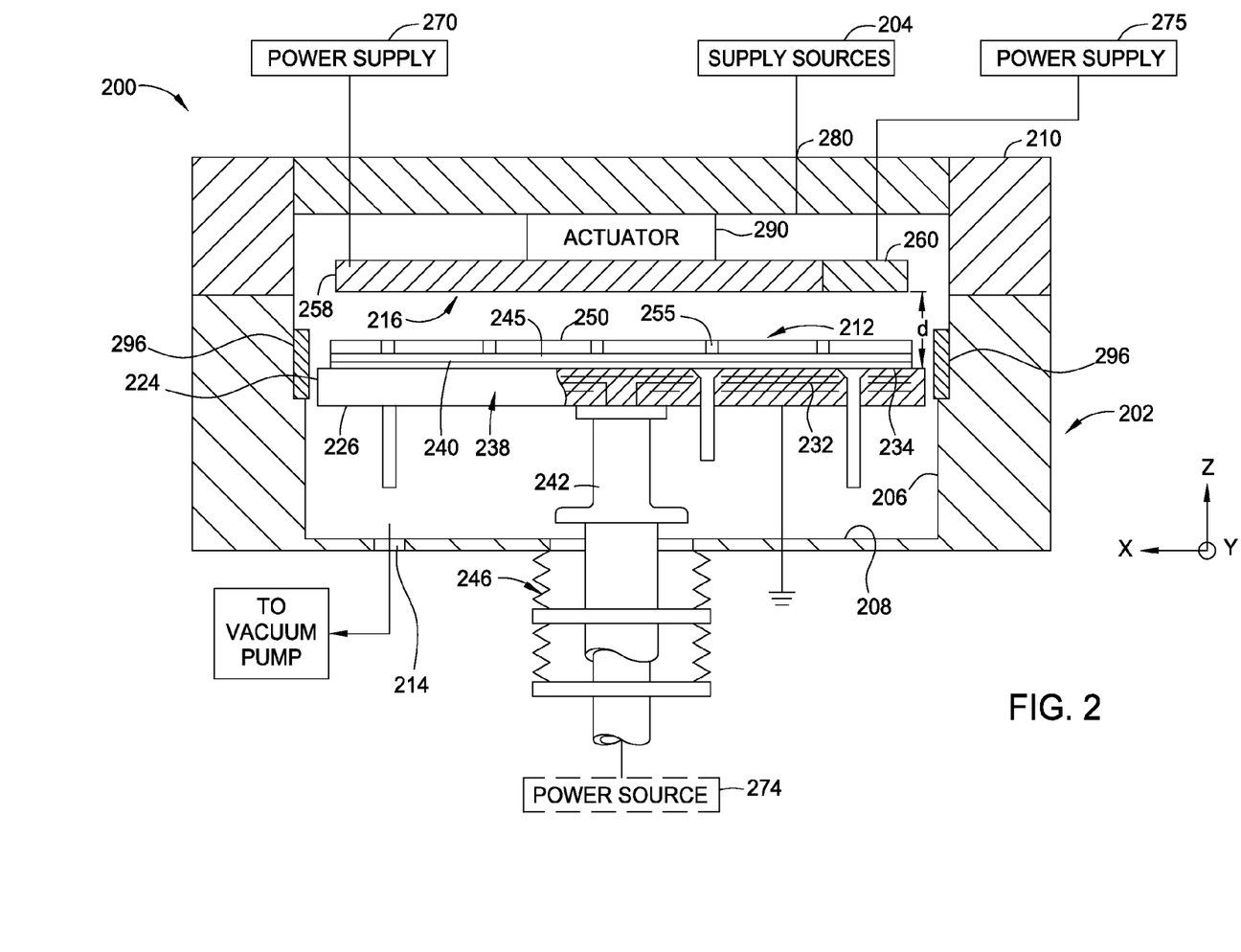
FIG. 2 is a schematic cross-sectional view of an apparatus for processing a substrate, according to one embodiment.

FIG. 2 is a schematic cross-sectional view of an apparatus for processing a substrate, according to one embodiment. As shown in the embodiment of FIG. 2, the apparatus may be in the form of a vacuum processing chamber 200. In other embodiments, the processing chamber 200 may not be coupled to a vacuum source.

The processing chamber 200 may be an independent processing chamber. Alternatively, the processing chamber 200 may be part of a processing system, such as, for example, an in-line processing system, a cluster processing system, or the track processing system as needed. The processing chamber 200 is described in detail below and may be used for a pre-exposure bake, a post-exposure bake, and/or other processing steps.

The processing chamber 200 includes chamber walls 202, an electrode assembly 216, and a substrate support assembly 238. The chamber walls 202 include sidewalls 206, a lid assembly 210, and a bottom 208. The chamber walls 202 partially enclose a processing volume 212. The processing volume 212 is accessed through a substrate transfer port (not shown) configured to facilitate movement of a substrate 240 into and out of the processing chamber 200. In embodiments where the processing chamber 200 is part of a processing system, the substrate transfer port may allow for the substrate 240 to be transferred to and from a transfer chamber.

A pumping port 214 may optionally be disposed through one of the lid assembly 210, sidewalls 206 or bottom 208 of the processing chamber 200 to couple the processing volume 212 to an exhaust port. The exhaust port couples the pumping port 214 to various vacuum pumping components, such as a vacuum pump. The pumping components may reduce the pressure of the processing volume 212 and exhaust any gases and/or process by-products out of the processing chamber 200. The processing chamber 200 may be coupled to one or more supply sources 204 for delivering one or more source compounds into the processing volume 212.

The substrate support assembly 238 is centrally disposed within the processing chamber 200. The substrate support assembly 238 supports the substrate 240 during processing. The substrate support assembly 238 may comprise an aluminum body 224 that encapsulates at least one embedded heater 232. In some embodiments, the substrate support assembly 238 may be an electrostatic chuck. The heater 232, such as a resistive element, is disposed in the substrate support assembly 238. The heater 232 controllably heats the substrate support assembly 238 and the substrate 240 positioned thereon to a predetermined temperature. The heater 232 is configured to quickly ramp the temperature of the substrate 240 and to accurately control the temperature of the substrate 240. In some embodiments, the heater 232 is connected to and controlled by the power source 274. The power source 274 may alternatively or additionally apply power to the substrate support assembly 238. The power source 274 may be configured similarly to the power source 270, discussed below.

In some embodiments, the substrate support assembly 238 may be configured to rotate. In some embodiments, the substrate support assembly 238 is configured to rotate about the z-axis. The substrate support assembly 238 may be configured to continuously or constantly rotate, or the substrate support assembly 238 may be configured to rotate in a step manner. For example, the substrate support assembly 238 may rotate a predetermined amount, such as 90°, 180°, or 270°, and then rotation may stop for a predetermined amount of time.

In other embodiments, the processing chamber 200 may include other heating sources. For example, heat lamps may be positioned within or outside the processing chamber 200. In other embodiments, one or more lasers may be used to heat a photoresist layer 250 (or other layer) positioned on the substrate 240 and/or the antennas 320 and 321 (shown in FIG. 3) of the electrode assembly 216. In other embodiments, the substrate support assembly 238 may be configured to circulate a high efficiency heat transfer fluid in order to more quickly increase the temperature of a substrate 240 positioned on the substrate support assembly 238.

Generally, the substrate support assembly 238 has a first surface 234 and a second surface 226. The first surface 234 is opposite the second surface 226. The first surface 234 is configured to support the substrate 240. The second surface 226 has a stem 242 coupled thereto. The substrate 240 is positioned on the first surface 234 of the substrate support assembly 238. The substrate 240 may be any type of substrate, such as a dielectric substrate, a glass substrate, a semiconductor substrate, or a conductive substrate. The substrate 240 may have a material layer 245 disposed thereon. The material layer 245 may be any desired layer. In other embodiments, the substrate 240 may have more than one material layer 245. The substrate 240 also has a photoresist layer 250 disposed over the material layer 245. The substrate 240 has been previously exposed to electromagnetic radiation in an exposure stage of a photolithography process. The photoresist layer 250 has latent image lines 255 formed therein from the exposure stage. The latent image lines 255 may be substantially parallel. In other embodiments, the latent image lines 255 may not be substantially parallel. Also as shown, the first surface 234 of the substrate support assembly 238 is separated from the electrode assembly 216 by a distance d in the z-direction. The stem 242 is coupled to a lift system (not shown) for moving the substrate support assembly 238 between an elevated processing position (as shown) and a lowered substrate transfer position. The lift system may accurately and precisely control the position of the substrate 240 in the z-direction. In some embodiments, the lift system may also be configured to move the substrate 240 in the x-direction, the y-direction, or the x-direction and the y-direction. The stem 242 additionally provides a conduit for electrical and thermocouple leads between the substrate support assembly 238 and other components of the processing chamber 200. A bellows 246 is coupled to the substrate support assembly 238 to provide a vacuum seal between the processing volume 212 and the atmosphere outside the processing chamber 200 and facilitate movement of the substrate support assembly 238 in the z-direction.

The lid assembly 210 may optionally include an inlet 280 through which gases provided by the supply sources 204 may enter the processing chamber 200. The supply sources 204 may optionally controllably pressurize the processing volume 212 with a gas, such as nitrogen, argon, helium, other gases, or combinations thereof. The gases from the supply sources 204 may create a controlled environment within the processing chamber 200. An actuator 290 may be optionally coupled between the lid assembly 210 and the electrode assembly 216. The actuator 290 is configured to move the electrode assembly 216 in one or more of the x, y, and z directions. The x and y directions are referred to herein as the lateral directions or dimensions. The actuator 290 enables the electrode assembly 216 to scan the surface of the substrate 240. The actuator 290 also enables the distance d to be adjusted. In some embodiments the electrode assembly 216 is coupled to the lid assembly 210 by a fixed stem (not shown). In other embodiments, the electrode assembly 216 may be coupled to the inside of the bottom 208 of the processing chamber 200, to the second surface 226 of the substrate support assembly 238, or to the stem 242. In still other embodiments, the electrode assembly 216 may be embedded between the first surface 234 and the second surface 226 of the substrate support assembly 238.

The electrode assembly 216 includes at least a first electrode 258 and a second electrode 260. As shown, the first electrode 258 is coupled to a power source 270, and the second electrode 260 is coupled to an optional power supply 275. In other embodiments, one of the first electrode 258 and the second electrode 260 may be coupled to a power supply and the other electrode may be coupled to a ground. In some embodiments the first electrode 258 and the second electrode 260 are coupled to a ground and the power source 274 delivers power to the substrate support and is a bipolar power supply that switches between a positive and negative bias. In some embodiments, the power source 270 or the power supply 275 may be coupled to both the first electrode 258 and the second electrode 260. In other embodiments, the power source 270 or the power supply 275 may be coupled to the first electrode 258, the second electrode 260, and the substrate support assembly 238. In such embodiments, the pulse delay to each of the first electrode 258, the second electrode 260, and the substrate support assembly 238 may be different. The electrode assembly 216 may be configured to generate an electric field parallel to the x-y plane defined by the first surface of the substrate support assembly 238. For example, the electrode assembly 216 may be configured to generate an electric field in one of the y direction, x direction or other direction in the x-y plane.

The power source 270 and the power supply 275 are configured to supply, for example, between about 500 V and about 100 kV to the electrode assembly 216, to generate an electric field having a strength between about 0.1 MV/m and about 100 MV/m. In some embodiments, the power source 274 may also be configured to provide power to the electrode assembly 216. In some embodiments, any or all of the power source 270, the power source 274, or the power supply 275 are a pulsed direct current (DC) power supply. The pulsed DC wave may be from a half-wave rectifier or a full-wave rectifier. The DC power may have a frequency of between about 10 Hz and 1 MHz. The duty cycle of the pulsed DC power may be from between about 5% and about 95%, such as between about 20% and about 60%. In some embodiments, the duty cycle of the pulsed DC power may be between about 20% and about 40%. In other embodiments, the duty cycle of the pulsed DC power may be about 60%. The rise and fall time of the pulsed DC power may be between about 1 ns and about 1000 ns, such as between about 10 ns and about 500 ns. In other embodiments, the rise and fall time of the pulsed DC power may be between about 10 ns and about 100 ns. In some embodiments, the rise and fall time of the pulsed DC power may be about 500 ns. In some embodiments, any or all of the power source 270, the power source 274, and the power supply 275 are an alternating current power supply. In other embodiments, any or all of the power source 270, the power source 274, and the power supply 275 are a direct current power supply.

In some embodiments, any or all of the power source 270, the power source 274, and the power supply 275 may use a DC offset. The DC offset may be, for example, between about 0% and about 75% of the applied voltage, such as between about 5% and about 60% of the applied voltage. In some embodiments, the first electrode 258 and the second electrode 260 are pulsed negatively while the substrate support assembly 238 is also pulsed negatively. In these embodiments, the first electrode 258 and the second electrode 260 are the substrate support assembly 238 are synchronized but offset. For example, the first electrode 258 may be at the "one" state while the substrate support assembly is at the "zero" state," then the substrate support assembly 238 in the one state while the first electrode 258 is at the zero state.

The electrode assembly 216 spans approximately the width of the substrate support assembly 238. In other embodiments, the width of the electrode assembly 216 may be less than that of the substrate support assembly 238. For example, the electrode assembly 216 may span between about 10% to about 80%, such as about 20% and about 40%, the width of the substrate support assembly 238. In embodiments where the electrode assembly 216 is less wide than the substrate support assembly 238, the actuator 290 may scan the electrode assembly 216 across the surface of the substrate 240 positioned on the first surface 234 of the substrate support assembly 238. For example, the actuator 290 may scan such that the electrode assembly 216 scans the entire surface of the substrate 240. In other embodiments, the actuator 290 may scan only certain portions of the substrate 240. Alternatively, the substrate support assembly 238 may scan underneath the electrode assembly 216.

In some embodiments, one or more magnets 296 may be positioned in the processing chamber 200. In the embodiment shown in FIG. 1, the magnets 296 are coupled to the inside surface of the sidewalls 206. In other embodiments, the magnets 296 may be positioned in other locations within the processing chamber 200 or outside the processing chamber 200. The magnets 296 may be, for example, permanent magnets or electromagnets. Representative permanent magnets include ceramic magnets and rare earth magnets. In embodiments where the magnets 296 include electromagnets, the magnets 296 may be coupled to a power source (not shown). The magnets 296 are configured to generate a magnetic field in a direction perpendicular or parallel to the direction of the electric field lines generated by the electrode assembly 216 at the first surface 234 of the substrate support assembly 238. For example, the magnets 296 may be configured to generate a magnetic field in the x-direction when the electric field generated by the electrode assembly 216 is in the y-direction. The magnetic field drives the charged species 355 (shown in FIG. 2) and polarized species (not shown) generated by the photoacid generators in the photoresist layer 250 in a direction perpendicular to the magnetic field, such as the direction parallel with the latent image lines 255. By driving the charged species 355 and polarized species in a direction parallel with the latent image lines 255, line roughness may be reduced. The uniform directional movement of the charged species 355 and polarized species is shown by the double headed arrow 370 in FIG. 3. In contrast, when a magnetic field is not applied, the charged species 355 and polarized species may move randomly, as shown by the arrows 370'.

Figure 3:
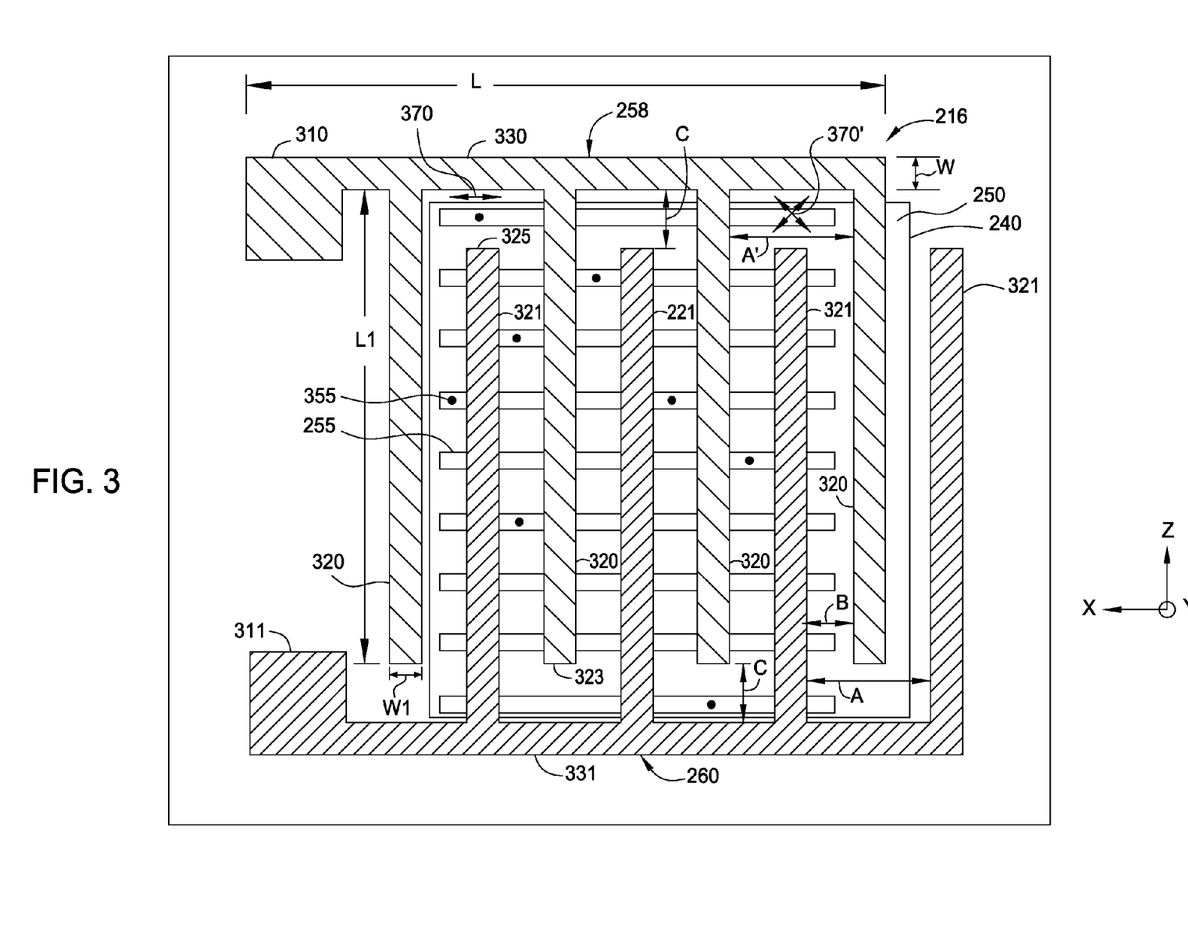
FIG. 3 is a top view of one embodiment of an electrode assembly disposed in the apparatus of FIG. 2.

Continuing to refer to FIG. 3, the electrode assembly 216 includes at least the first electrode 258 and the second electrode 260. The first electrode 258 includes a first terminal 310, a first support structure 330, and one or more antennas 320. The second electrode 260 includes a second terminal 311, a second support structure 331, and one or more antennas 321. The first terminal 310, the first support structure 330, and the one or more antennas 320 of the first electrode 258 may form a unitary body. Alternatively, the first electrode 258 may include separate portions that may be coupled together. For example, the one or more antennas 320 may be detachable from the first support structure 330. The second electrode 260 may similarly be a unitary body or be comprised of separate detachable components. The first electrode 258 and the second electrode 260 may be prepared by any suitable means. For example, the first electrode 258 and the second electrode 260 may be fabricated by machining, casting, or additive manufacturing.

The first support structure 330 may be made from a conductive material, such as metal. For example, the first support structure 330 may be made of silicon, polysilicon, silicon carbide, molybdenum, aluminum, copper, graphite, silver, platinum, gold, palladium, zinc, other materials, or mixtures thereof. The first support structure 330 may have any desired dimensions. For example, the length L of the first support structure 330 may be between about 25 mm and about 450 mm, for example, between about 100 mm and about 300 mm. In some embodiments, the first support structure 330 has a length L approximately equal to a diameter of a standard semiconductor substrate. In other embodiments, the first support structure 330 has a length L that is larger or smaller than the diameter of a standard semiconductor substrate. For example, in different representative embodiments, the length L of the first support structure 330 may be about 25 mm, about 51 mm, about 76 mm, about 100 mm, about 150 mm, about 200 mm, about 300 mm, or about 450 mm. The width W of the first support structure 330 may be between about 2 mm and about 25 mm. In other embodiments, the width W of the first support structure 330 is less than about 2 mm. In other embodiments, the width W of the first support structure 330 is greater than about 25 mm. The thickness of the first support structure 330 may be between about 1 mm and about 10 mm, such as between about 2 mm and about 8 mm, such as about 5 mm. In some embodiments, the first support structure 330 may be square, cylindrical, rectangular, oval, rods, or other shapes. Embodiments having round exterior surfaces may avoid arcing.

The support structure 330 may be made of the same materials as the second support structure 331. The range of dimensions suitable for the first support structure 330 is also suitable for the second support structure 331. In some embodiments, the first support structure 330 and the second support structure 331 are made of the same material. In other embodiments, the first support structure 330 and the second support structure 331 are made of different materials. The lengths L, widths W, and thicknesses of the first support structure 330 and the second support structure 331 may be the same or different.

The one or more antennas 320 of the first electrode 258 may also be made from a conductive material. The one or more antennas 320 may be made from the same materials as the first support structure 330. The one or more antennas 320 of the first electrode 258 may have any desired dimensions. For example, a length L1 of the one or more antennas 320 may be between about 25 mm and about 450 mm, for example, between about 100 mm and about 300 mm. In some embodiments, the first support structure 330 has a length L1 approximately equal to the diameter of a standard substrate. In other embodiments, the length L1 of the one or more antennas 320 may be between about 75% and 90% of the diameter of a standard substrate. A width W1 of the one or more antennas 220 may be between about 2 mm and about 25 mm. In other embodiments, the width W1 of the one or more antennas 320 is less than about 2 mm. In other embodiments, the width W1 of the one or more antennas 320 is greater than about 25 mm. The thickness of the one or more antennas 320 may be between about 1 mm and about 10 mm, such as between about 2 mm and about 8 mm. The one or more antennas 320 may have a cross-section that is square, rectangular, oval, circular, cylindrical, or another shape. Embodiments having round exterior surfaces may avoid arcing.

Each of the antennas 320 may have the same dimensions. Alternatively, some of the one or more antennas 320 may have different dimensions than one or more of the other antennas 320. For example, some of the one or more antennas 320 may have different lengths L1 than one or more of the other antennas 320. Each of the one or more antennas 320 may be made of the same material. In other embodiments, some of the antennas 320 may be made of a different material than other antennas 320.

The antennas 321 may be made of the same range of materials as the antennas 320. The range of dimensions suitable for the antennas 320 is also suitable for the antennas 321. In some embodiments, the antennas 320 and the antennas 321 are made of the same material. In other embodiments, the antennas 320 and the antennas 321 are made of different materials. The lengths L1, widths W1, and thicknesses of the antennas 320 and the antennas 321 may be the same or different.

The antennas 320 may include between 1 and about 40 antennas 320. For example, the antennas 320 may include between about 4 and about 40 antennas 320, such as between about 10 and about 20 antennas 220. In other embodiments, the antennas 320 may include more than 40 antennas 320. In some embodiments, each of the antennas 320 may be substantially perpendicular to the first support structure 330. For example, in embodiments where the first support structure 330 is straight, each antenna 320 may be substantially parallel to the first support structure 330. Each of the antennas 320 may be substantially parallel to each of the other antennas 320. Each of the antennas 321 may be similarly positioned with respect to the support structure 331 and each other antenna 321.

Each of the antennas 320 has a terminal end 323. Each of the antennas 321 has a terminal end 325. A distance C is defined between the first support structure 330 and the terminal end 325. A distance C' is defined between the second support structure 331 and the terminal end 323. Each of the distances C and C' may be between about 1 mm and about 10 mm. In other embodiments, the distances C and C' may be less than about 1 mm or greater than about 10 mm. In some embodiments, the distance C and the distance C' are equal. In other embodiments, the distance C and the distance C' are different.

A distance A is defined between facing surfaces of one of the antennas 321 and an adjacent one of the antennas 321. The distance A' is defined between facing surfaces of one antenna 320 and an adjacent one the antennas 320. The distances A and A' may be greater than about 6 mm. For example, the distances A and A' may be between about 6 mm and about 20 mm, such as between about 10 mm and about 15 mm. The distances A and A' between each adjacent antennas 321, 320 may be the same or different. For example, the distances A' between the first and second, second and third, and third and fourth antennas of the one or more antennas 320 may be different. In other embodiments, the distances A' may be the same.

A distance B is defined between facing surfaces of one of the antennas 320 and an adjacent one of the antennas 321. The distance B may be, for example, greater than about 1 mm. For example, the distance B may be between about 2 mm and about 10 mm, such as between about 4 mm and about 6 mm. The distance B defined between may be the same, each distance B may be different, or some distances B may be the same and some distances B may be different. Modifying the distance B allows for easy control of the electric field strength.

The antennas 320, 321 may be oriented in an alternating arrangement above the photoresist layer 250. For example, the antennas 320 of the first electrode 258 and the antennas 321 of the second electrode 260 may be positioned such that at least one of the antennas 320 is positioned between two of the antennas 321. Additionally, at least one antenna 321 may be positioned between two of the antennas 320. In some embodiments, all but one of the antennas 320 is positioned between two of the antennas 321. In those embodiments, all but one of the antennas 321 may be positioned between two of the antennas 320. In some embodiments, the antennas 320 and the antennas 321 may each have only one antenna.

In some embodiments, the first electrode 258 has a first terminal 310, and the second electrode 260 has a second terminal 311. The first terminal 310 may be a contact between the first electrode 358 and the power source 270, the power supply 275, or a ground. The second terminal 311 may be a contact between the second electrode 260 and the power source 270, the power source 270, or a ground. The first terminal 310 and the second terminal 311 are shown as being at one end of the first electrode 258 and the second electrode 260, respectively. In other embodiments, the first terminal 310 and the second terminal 311 may be positioned at other locations on the first electrode 258 and the second electrode, respectively. The first terminal 310 and the second terminal 311 have different shapes and sizes than the first support structure 330 and the support structure 331, respectively. In other embodiments, the first terminal 310 and the second terminal 311 may have generally the same shapes and sizes as the first support structure 330 and the support structure 331, respectively.

In operation, a voltage may be supplied from a power supply, such as the power source 270, the power source 274, or the power supply 275, to the first terminal 310, the second terminal 311, and/or the substrate support assembly 238. The supplied voltage creates an electric field between each antenna of the one or more antennas 320 and each antenna of the one or more antennas 321. The electric field will be strongest between an antenna of the one or more antennas 320 and an adjacent antenna of the one or more antennas 321. The interleaved and aligned spatial relationship of the antennas 320, 321 produces an electric field in a direction parallel to the plane defined by the first surface 234 of the substrate support assembly 238. The substrate 240 is positioned on the first surface 234 such that the latent image lines 255 are parallel to the electric field lines generated by the electrode assembly 216. Since the charged species 355 are charged, the charged species 355 are affected by the electric field. The electric field drives the charged species 355 generated by the photoacid generators in the photoresist layer 250 in the direction of the electric field. By driving the charged species 355 in a direction parallel with the latent image lines 255, line edge roughness may be reduced. The uniform directional movement is shown by the double headed arrow 370. In contrast, when a voltage is not applied to the first terminal 310 or the second terminal 311, an electric field is not created to drive the charged species 355 in any particular direction. As a result, the charged species 355 may move randomly, as shown by the arrows 370'.

Figure 4A:
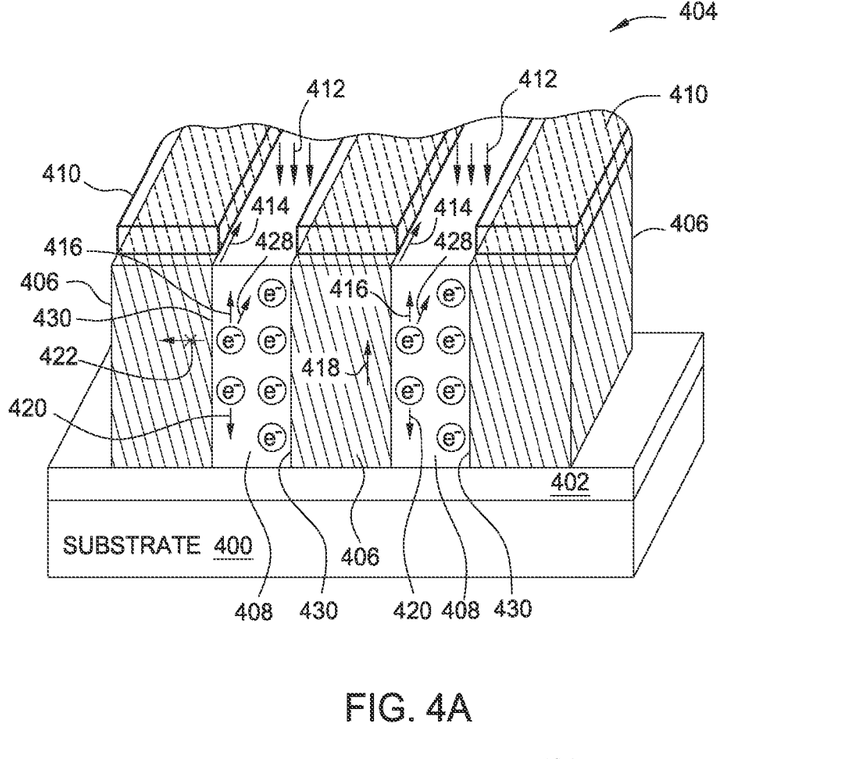
FIG. 4A-4B depict an acid distribution control of a photoresist layer during an exposure process.

FIG. 4A depicts a photoresist layer 404 disposed on a material layer 402 formed on a substrate 400 during a lithography exposure process. As discussed above, an electric field from the electrode 116, as well as a magnetic field from the magnets 296, may be applied during a lithography exposure process, pre- or post exposure baking process. In the example depicted in FIGS. 4A and 4B, the electric field and/or and magnetic field is applied during a lithographic exposure process. During the lithographic exposure process, a light radiation 412 is directed to a first region 408 of the photoresist layer 404 while with a second region 406 of the photoresist layer 404 protected by a photomask 410. Photoacid, shown as e⁻ in FIG. 4A, is generated in the exposed first region 408 in the photoresist layer 404 when photoacidphotoacid generator (PAG) is exposed to the light radiation 412, such as a UV light radiation. In conventional processes, photoacidphotoacid may be primarily generated in the exposed first region 408 of the photoresist layer 404 during the light exposure process. However, oftentimes, movement of photoacid are generally random and photoacid distribution may not be evenly distributed in the first region 408 or may not have a clear boundary set an the interface 430 formed in a plane (interfaced with the second region 406) defining between the first region 408 and the second region 406, resulting in portion of photoacid drifted and diffused into the second region 406, as shown in the arrow 422, unintended to have photoacid generation. As such, lateral photoacid movement (e.g., a direction parallel to a planar surface of the substrate 400) drifted into the second region 406, as shown in the arrow 422, may result in line edge roughness, resolution loss, photoresist footing, profile deformation, thus causing inaccurate features transfer to the underlying material layer 402 and/or eventually leading to device failure.

By applying an electric field and/or magnetic field to the photoresist layer 404, distribution of photoacid in the exposed first region 408 may be efficiently controlled and confined. The electric field as applied to the photoresist layer 404 may move photoacid is vertical directions (e.g., y direction shown by arrows 416 and 420 substantially perpendicular to the planar surface of the substrate 400) with minimal lateral motion (e.g., x direction shown by the arrow 422) without diffusing into the adjacent second region 406. Generally, photoacid may have certain polarity that may be effected by the electric field or magnetic field applied thereto, thus orienting photoacid in certain directions, thus creating a desired directional movement of the photoacid in the exposed first region 408 without crossing into the adjacent protected second region 406. In one example, the photoacid may further be controlled to move directionally at a longitudinal direction (e.g., z direction shown by arrow 428, defined in a plane interfaced with the second portion 406 of the photoresist layer 404 protected by the photomask 410) along a lateral plane, as shown by arrow 414, so as to control the longitudinal distribution of photoacid confined in the exposed first region 408 without crossing at a x direction, as shown by arrow 422, into the second region 406 of the photoresist layer 404. The magnetic field generated to the photoresist layer 404 may cause the electrons to orbit along a certain magnetic line, such as the longitudinal direction (e.g., z direction shown by arrow 428) so as to further control the photoacid in a desired three-dimensional distribution. The interaction between the magnetic field and the electric field may optimize trajectory of photoacid at a certain path as desired and confined in the exposed first region 408. Furthermore, vertical photoacid movement is desired to smooth out standing waves that are naturally produced by the light exposure tool, thus enhancing exposure resolution. In one embodiment, an electric field having a strength between about 0.1 MV/m and about 100 MV/m may be applied to the photoresist layer 404, during a lithographic exposure process, pre- or post baking process, to confine photoacid generated in the photoresist layer 404 in a vertical direction, e.g., at a y direction. In one embodiment, a magnetic field of between between 0.1 Tesla (T) and 10 Tesla (T), along with the electric field, may be applied to the photoresist layer 404, during a lithographic exposure process, pre- or post baking process, to confine photoacid generated in the photoresist layer 404 in both longitudinal direction and vertical direction, e.g., at y and z directions, with minimum lateral direction, e.g., at x direction. While in combination of the magnetic field along with the electric field, the photoacid as generated may be further confined to be distributed in the longitudinal direction, e.g., at a the direction 428, remained in the first region 408 of the photoresist layer 404, parallel along the interface 430 within the exposed first region 408.

Figure 4B:
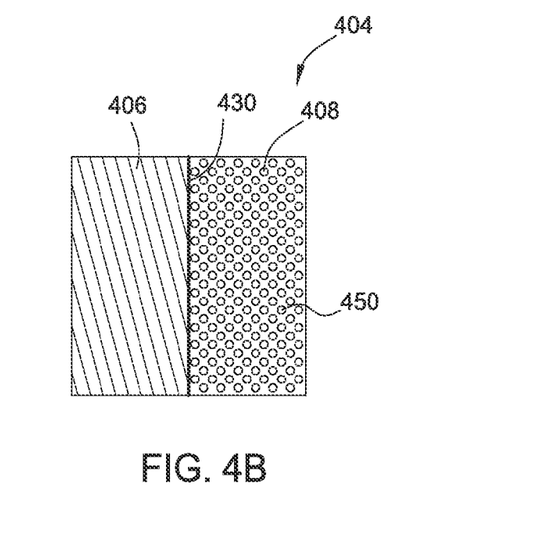

FIG. 4B depicts a top view of the photoresist layer 404 including a portion of the first region 408 and the second region 406 defined between the interface 430. After the electric and/or magnetic field applied to the photoresist layer 450, distribution of photoacid 450 may be primarily located and maintained in the first region 408 without diffusing cross to the second region 406. Thus, by doing so, a more clearly defined interface 430 may be obtained, thus forming a patterned photoresist layer with sharp profile, high resolution and minimum line edge roughness and defects.

Figure 5:
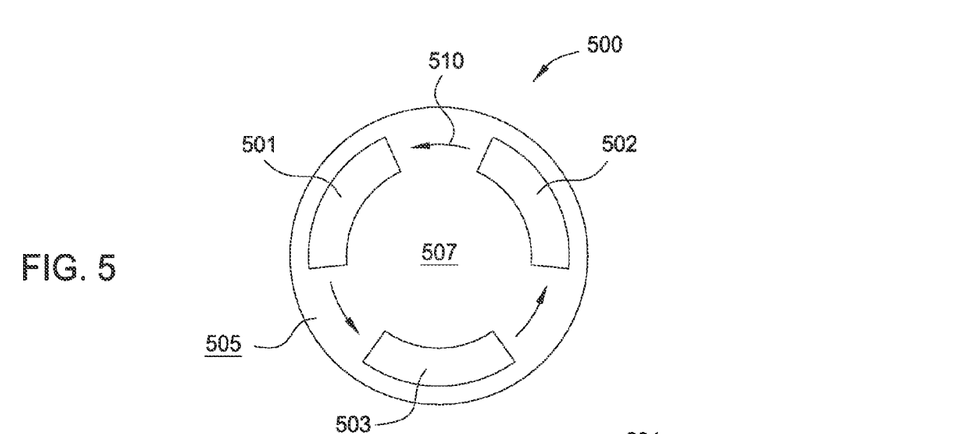
FIG. 5 depicts an acid distribution control at a substrate edge.

FIG. 5 depicts another profile of photoacid distribution that may be controlled by utilizing an electric field, magnetic field, or combinations thereof to specifically control the photoacid located at certain zones. In this example, a rotatable substrate support may also be utilized to drive photoacid moving in a circular motion. For example, in a contact hole manufacturing process, the openings formed in the photoresist layer are basically in circular shape. In such a case, photoacid is desired to be driven in a vertical direction, e.g., a y direction, as well as in a circular direction, as shown in the arrow 510 in FIG. 5, so as to form a contact circular hole in the photoresist layer with desired circular shape and accurate profile and dimension. It is noted that the circular direction as described therein is related to a circular movement of photoacid moving in a plane parallel with a planar surface of a substrate 500. In one embodiment, the electric field and the magnetic field may be specifically applied to edges zones, such as edge zones 501, 503, 502 spaced away from a center zone 507 on the substrate 500 defined on the planar surface of the substrate 500 to specifically control the profile of the contact holes formed at an edge 505 of the substrate 500.

Figure 6:
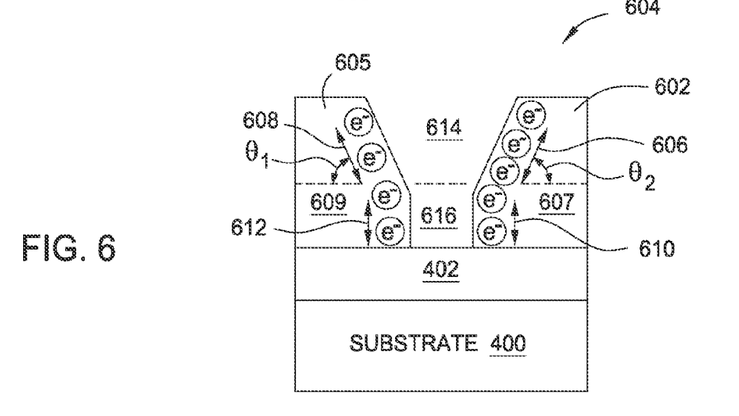
FIG. 6 depicts an acid distribution control of a photoresist layer with a specific tapered profile during an exposure process.

FIG. 6 depicts another embodiment of control of the photoacid diffusion/distribution formed in a photoresist layer 604 disposed on the material layer 402 of the substrate 400. The photoacid drift/diffusion control process may control distribution/movement of the photoacid in a desired direction so that after a development and rinse process, a tapered profile may be formed in the photoresist layer 604. The photoacid may be initially controlled to diffuse at a first direction 608 in a first upper region 605 of the photoresist layer 604 with a first slope having an angle $\theta_1$ relative to a horizontal plane. Similarly, photoacid may be controlled to diffuse at a second direction 606 in a second upper region 602 of the photoresist layer 604 with a second slope having an angle $\theta_2$ relative to the horizontal plane. The angles $\theta_1$, $\theta_2$ may be at a similar range so as to have the symmetric profile formed in the second upper region 605 and the first upper region 602 of the photoresist layer 604. A bottom portion 609, 607 formed in the first region 605 and the second region 602 of the photoresist layer 604 respectively may be controlled by having the photoacid movement predominantly maintained in a vertical direction 612, 610. By doing so, the tapered/sloped structure defined by the first and the second upper regions 605, 602 of the photoresist layer 604 may form a flare-out-opening region 614 with a wider dimension, as compared to the straight-opening region 616 defined by the bottom portion 609, 607 in the first and the second lower portion 609, 607. The flare-out-opening region 614 may provide a wider etching window when performing an etching process to transfer features into the underlying material layer 402. The lower straight-opening region 616 may then serve as a mask structure utilizing the opening formed with desired smaller dimension to assist transferring features into the underlying material layer 402 with smaller dimension while providing a wide etching process window provided by the wider flare-out-opening region 614 formed thereabove. It is believed that flare-out-opening region 614 may reduce likelihood of early close-up or excess etching by-product buildup at the corners of the opening, thus preventing the etching process from early termination so as to extend the etching process until the underlying material layer 402 is etched to a predetermined depth. Furthermore, by utilizing the a photoresist layer with a shrink profile at its lower portion (or a flared-out opening at its upper portion), features with smaller dimension may be obtained and the capability of manufacturing small features in a material layer using existing materials of photoresist layer and the lithographic exposure tool may be further extended to next nanometer generation, such as dimensions of less than 20 nm.

Figure 7:
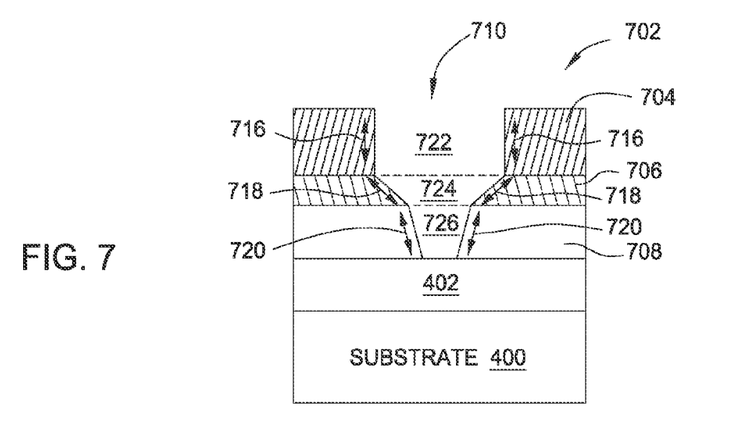
FIG. 7 depicts an acid distribution control of a photoresist layer with multiple mask layers with a specific tapered profile during an exposure process.

FIG. 7 depicts yet another embodiment of control of the photoacid diffusion/distribution formed in a photoresist layer 702 disposed on the material layer 402 of the substrate 400. The photoresist layer 702 may have photoacid distributed in a manner that can form an opening 710, after a development and rinse process, with three opening regions 722, 724, 726 each having different profiles, configurations and dimensions. The three openings regions 722, 724, 726 included in the photoresist layer 702 may be individually defined between a first mask layer 704, a second mask layer 706 and a third mask layer 708. In one example, the first mask layer 704 is an organic resist layer. The second mask layer 706 is an ARC layer fabricated from a group consisting of silicon oxide, silicon nitride, silicon oxynitride, silicon carbide, amorphous carbon, doped amorphous carbon, titanium nitride, titanium oxynitride, combinations thereof and the like. The third layer 708 may be a dielectric layer selected from a group consisting of silicon oxide, TEOS oxide, USG, SOG, or organic silicon and oxide containing material, combinations thereof, and the like.

During a lithographic exposure process and/or a pre- or post baking process, distribution/diffusion of photoacid in the exposed photoresist layer 702 may be controlled in a manner that distributes the photoacid in a vertical direction 716 in the first mask layer 704. Subsequently, an isotropic etching process, or other suitable chemical shrink/etch shrink processes, may be performed to form the second opening region 724 with a tapered profile with a first desired slope 718 in the second mask layer 706, to shrink down the size of the second opening region 724. Furthermore, an additional isotropic etching process, or other suitable chemical shrink/etch shrink processes, may be performed further to further etch the third mask layer 708 to form the third opening region 726 with even reduced dimension. Another tapered profile with a second steeper slope 720 may be formed in the third mask layer 708 to create the third opening region 726. In one embodiment, the second slope 720 may be about 20 percent to 50 percent higher of the first slope 718 formed in the second and the third mask layer 706, 708 respectively. By arranging the opening 710 with different dimensions at the top portion and the lower portion of the photoresist layer 702, a good control of an etching process as well as reduced small dimension feature transfer may be obtained, thus widening etching process window as well as extending manufacturing feature geometries with even reduced dimension without significantly increasing manufacturing cost.

Figure 8:
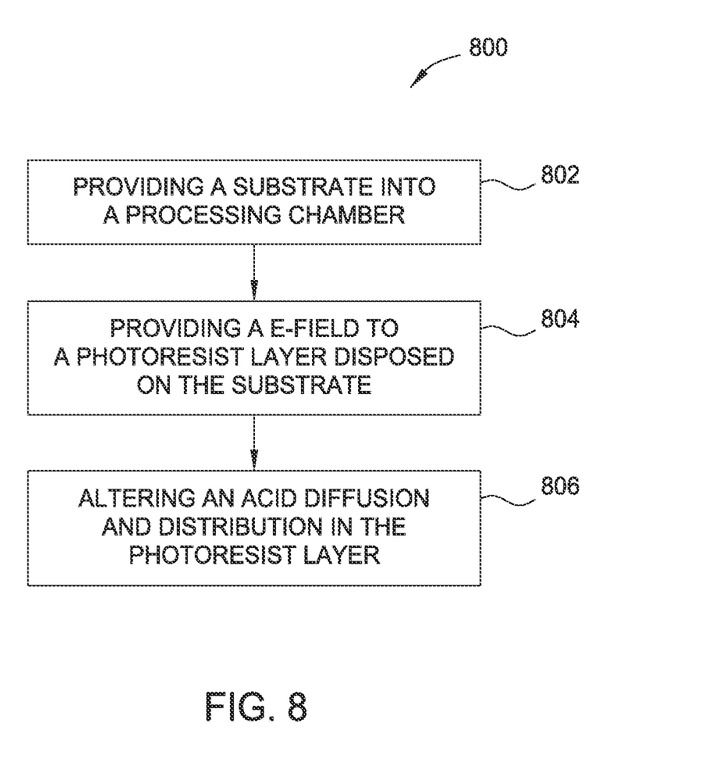
FIG. 8 is a flow diagram of one method of control acid distribution of a photoresist layer during an exposure process.

FIG. 8 depicts a flow diagram of a method 800 for controlling photoacid distribution/diffusion in a photoresist layer during a lithographic exposure process or during a pre- or a post-baking process. The method 800 beings at block 802 by positioning a substrate, such as the substrate 400 described above, into a processing chamber, such as the processing chamber 200 depicted in FIGS. 2-3, with an electrode assembly and a magnetic assembly disposed therein. At block 804, after the substrate 400 is positioned in place, an electric field and/or a magnetic field, may be individually or collectively applied to the processing chamber to control photoacid movement occurred in a photoresist layer unprotected (or protected depending on the types of photoresist layer being used) by a photomask disposed on the substrate. At block 806, after the electric field and/or a magnetic field is individually or collectively applied to the photoresist layer disposed on the substrate, photoacid as generated may be moved primarily in a vertical direction, a longitudinal direction, a circular direction, rather than a lateral direction, so as to reduce likelihood of photoacid diffused into a region unintended to include photoacid. By utilizing a directional control of photoacid distribution in a predetermined path, a shape edge profile without blurring, high resolution and minimum line edge roughness patterned photoresist layer may be obtained.

The previously described embodiments have many advantages, including the following. For example, the embodiments disclosed herein may reduce or eliminate line edge/width roughness with high resolution and sharp edge profile. The aforementioned advantages are illustrative and not limiting. It is not necessary for all embodiments to have all the advantages.

While the foregoing is directed to embodiments of the present disclosure, other and further embodiments of the disclosure may be devised without departing from the basic scope thereof, and the scope thereof is determined by the claims that follow.

What is claimed is:

1. A method of processing a substrate, the method comprising:
    applying a photoresist layer comprising a photoacid generator to a substrate;
    exposing a first portion of the photoresist layer unprotected by a photomask to a radiation light in a lithographic exposure process; and
    applying an electric field and a magnetic field to alter movement of photoacid generated from the photoacid generator substantially in a vertical direction.

2. The method of claim 1, wherein the electric field and the magnetic field is applied to the photoresist layer during the lithographic exposure process.

3. The method of claim 1, wherein applying the photoresist layer further comprises:
    performing a pre-exposure baking process to the photoresist layer disposed on the substrate, wherein the electric field and the magnetic field is applied to the photoresist layer during the pre-exposure baking process.

4. The method of claim 1, wherein exposing portions of the photoresist layer further comprises:
    performing a post-exposure baking process to the photoresist layer disposed on the substrate after the lithographic exposure process, wherein the electric field and the magnetic field is applied to the photoresist layer during the post-exposure baking process.

5. The method of claim 1, wherein applying the electric field and the magnetic field further comprises:
    simultaneously applying electric field and the magnetic field to the photoresist layer.

6. The method of claim 1, wherein applying the electric field and the magnetic field further comprises:
    controlling photoacid generated in the first portion of the photoresist layer in a horizontal direction defined in a horizontal plane interfaced with a second portion of the photoresist layer protected by the photomask during the lithographic exposure process.

7. The method of claim 1, wherein applying the electric field and the magnetic field further comprises:
    controlling photoacid generated in the first portion of the photoresist layer in a circular direction defined in a plane parallel with a planar surface of the substrate.

8. The method of claim 1, the electric field applied at the photoresist layer has a strength between about 0.1 MV/m and about 100 MV/m.

9. The method of claim 1, the magnetic field applied at the photoresist layer has a strength between about 0.1 Tesla (T) and 10 Tesla (T).

10. The method of claim 1, wherein applying the electric field and the magnetic field further comprises:
    distributing photoacid in the photoresist layer in a direction to form a tapered profile in a patterned photoresist layer after a development process is performed to remove the first portion of the photoresist layer.

11. The method of claim 1, wherein the photoresist layer includes a first, a second and a third mask layer, wherein the first mask is an organic layer, and the second mask layer and the third mask layer are both dielectric layers.

12. The method of claim 11, wherein the second mask layer is a silicon oxynitride layer or an amorphous carbon layer and the third layer is a silicon oxide layer.

13. The method of claim 11, wherein a first opening formed in the first mask layer has substantially a vertical straight profile with a first dimension.

14. The method of claim 13, wherein a second opening formed in the second mask layer has a tapered profile with a second dimension smaller than the first dimension of the first opening.

15. The method of claim 14, wherein a third opening formed in the third mask layer has a tapered profile with a third dimension smaller than the second dimension of the second opening.

16. The method of claim 15, wherein the tapered profile formed in the third mask layer has a slope greater than a slope formed in the tapered profile formed in the second mask layer.

17. A method of processing a substrate, the method comprising:
applying a photoresist layer comprising a photoacid generator to a substrate;
exposing a first portion of the photoresist layer unprotected by a photomask to a radiation light in a lithographic exposure process; and
orienting photoacid formed in the first portion of the photoresist layer by applying an electric field and a magnetic field to the photoresist layer in a vertical direction perpendicular to a planar surface of the substrate.

18. The method of claim 17, wherein orienting photoacid further comprising:
directing movement of photoacid in a horizontal direction defined in a plane interfaced with a second portion of the photoresist layer protected by the photomask.

19. A method of processing a substrate, the method comprising:
applying a photoresist layer comprising a photoacid generator to a substrate;
exposing a first portion of the photoresist layer unprotected by a photomask to a radiation light in a lithographic exposure process; and
orienting photoacid formed in the first portion of the photoresist layer by applying an electric field and a magnetic field to the photoresist layer to minimize a lateral movement of photoacid.

* * * * *